United States Patent [19]

Cavins et al.

[11] Patent Number: 5,731,238

[45] Date of Patent: Mar. 24, 1998

[54] INTEGRATED CIRCUIT HAVING A JET VAPOR DEPOSITION SILICON NITRIDE FILM AND METHOD OF MAKING THE SAME

[75] Inventors: Craig Allan Cavins, Pflugerville; Hsing-Huang Tseng; Ko-Min Chang, both of Austin, all of Tex.

[73] Assignee: Motorola Inc., Schaumburg, Ill.

[21] Appl. No.: 695,821

[22] Filed: Aug. 5, 1996

[51] Int. Cl.$^6$ .......................... H01L 21/336; H01L 21/31
[52] U.S. Cl. .......................... 438/261; 438/787; 438/791; 438/909
[58] Field of Search .................. 437/40, 41, 43, 437/52; 438/261, 787, 791, 909

[56] References Cited

U.S. PATENT DOCUMENTS

| | | | |
|---|---|---|---|
| 4,688,078 | 8/1987 | Hseih | 357/23.5 |
| 4,788,082 | 11/1988 | Schmitt | 427/248 |
| 5,256,205 | 10/1993 | Schmitt et al. | 118/723 |
| 5,356,672 | 10/1994 | Schmitt et al. | 427/446 |
| 5,356,673 | 10/1994 | Schmitt et al. | 427/446 |
| 5,368,897 | 11/1994 | Kurihara et al. | 427/450 |
| 5,403,399 | 4/1995 | Kurihara et al. | 118/723 |

OTHER PUBLICATIONS

L. Vishnubhotla et al., "Mobility & Reliability Improvements of Fluorinated Gate Oxide for VLSI Technology", International Symposium on VLSI Technology, Systems, and Applications, Jun. 1995, Taiwan, pp 44–52.

X. Wang et al., "Highly Reliable Silicon Nitride Films Made by Jet Deposition", Japanese Journal of Applied Physics, Feb. 1995, vol. 34, No. 2b, pp. 955–958.

X. Wang et al., "Studies of Boron Penetration and Oxidation Resistance in Ultra–Thin JVD Silicon Nitride", APRDL, Oct. 1995, pp. 1–2.

X. Wang et al., "Extending Gate Dielectric Scaling Limit by Use of Nitride or Oxynitride", 1995 Symposium on VLSI Technology Digest of Technical Papers, pp. 109–110, month unknown.

D. Wang et al., "Highly–Quality MNS Capacitors Prepared by Jet Vapor Deposition at Room Temperature", IEEE Electron Device Letters, vol. 13, No. 9, Sep. 1992, pp. 482–484.

*Primary Examiner*—John Niebling
*Assistant Examiner*—Michael S. Lebentritt
*Attorney, Agent, or Firm*—George R. Meyer

[57] ABSTRACT

An integrated circuit (10) is formed using jet vapor deposition (JVD) silicon nitride. A non-volatile memory device (11) has a tunnel dielectric layer (27) and an inter-poly dielectric layer (31) that can be formed from JVD silicon nitride. A transistor (12,13,40) is formed that has a gate dielectric material made from JVD silicon nitride. In addition, a passivation layer (47) can be formed overlying a semiconductor device (40) that is formed from JVD silicon nitride.

22 Claims, 2 Drawing Sheets

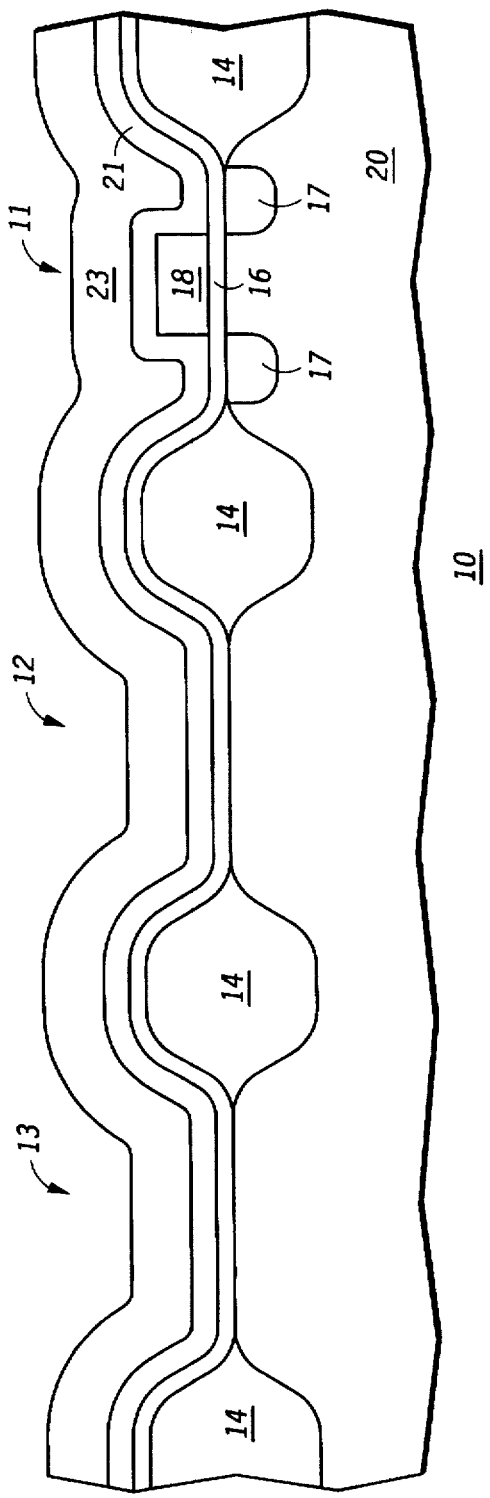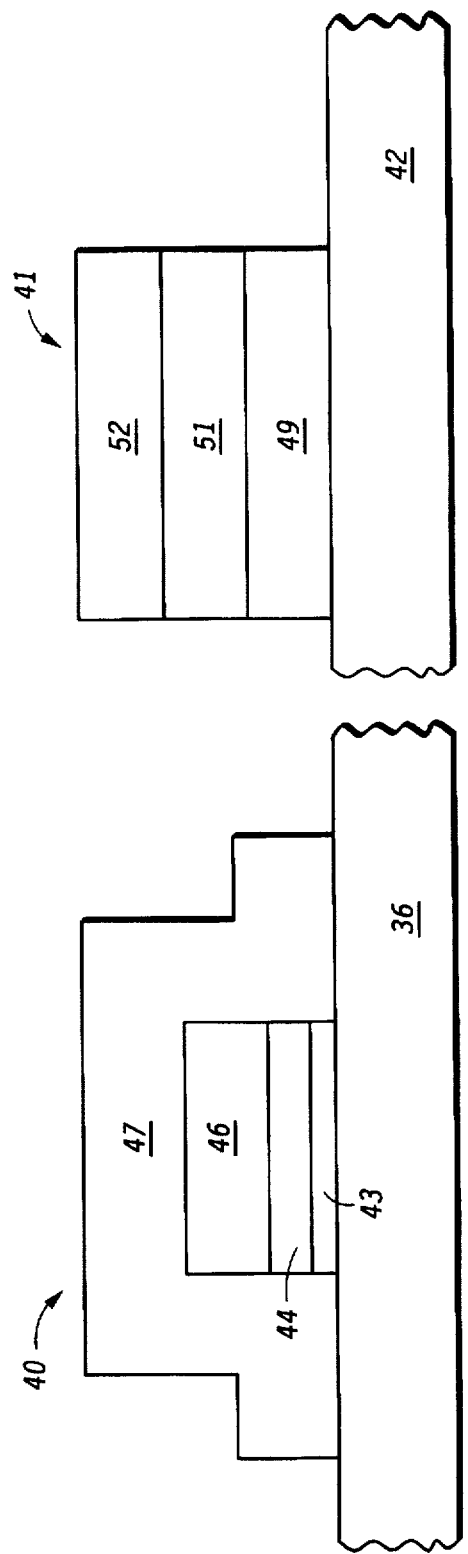

INTEGRATED CIRCUIT HAVING A JET VAPOR DEPOSITION SILICON NITRIDE FILM AND METHOD OF MAKING THE SAME

BACKGROUND OF THE INVENTION

This invention relates, in general, to semiconductor devices, and more particularly to semiconductor devices employing dielectric films.

Silicon nitride is an insulating layer that is used in semiconductor devices for different applications. Traditionally, silicon nitride films are formed by either a conventional chemical vapor deposition (CVD) process or a conventional plasma enhanced chemical vapor deposition (PECVD) process at a temperature of about 300° C. to 1100° C. As used in this specification, conventional CVD and conventional PECVD means a chemical vapor type of deposition using a hydrogen-containing nitrogen source gas, such as ammonia ($NH_3$). The high resistance value of silicon nitride film formed by conventional CVD or conventional PECVD (hereinafter "conventional silicon nitride film") makes it suitable for use in providing electrical isolation between conductive structures.

However, other electrical and physical properties of a conventional silicon nitride film make it inappropriate for use in non-volatile memory structures and other semiconductor device structures. For example, it is well known that although a conventional silicon nitride film has a higher dielectric constant than silicon dioxide, a conventional silicon nitride film is susceptible to Frenkel-Poole conduction. In other words, conventional silicon nitride films make poor dielectric layers because of the ease at which leakage current travels through silicon nitride. Consequently, the use of silicon nitride films in non-volatile memory devices requires that the silicon nitride layer be sandwiched between two layers of silicon dioxide. Such a structure is often referred to as an ONO stack. ONO stacks require two additional process steps to take advantage of the electrical characteristics of silicon nitride.

As previously stated, a conventional silicon nitride film is formed using a hydrogen-containing nitrogen source gas. As the film is deposited, hydrogen becomes incorporated into the film. For reasons still not fully understood, the presence of hydrogen in a silicon nitride passivation film degrades the reliability and performance of non-volatile memory cells. As a result, silicon nitride films are generally avoided as passivation layers in conjunction with non-volatile memory cells.

Although conventional silicon nitride films have desirable properties as an insulating layer, their electrical and physical properties can make their use as a dielectric material or as a passivation film impractical. The relative high temperature processing necessary to form these silicon nitride films also limits their use in semiconductor manufacturing.

By now it should be appreciated that it would be advantageous to provide a new insulating material that has improved electrical and physical characteristics over conventional silicon nitride.

BRIEF DESCRIPTION OF THE DRAWINGS

FIGS. 2–3 include cross-sectional views of the integrated circuit during the fabrication process;

FIG. 4 include an enlarged cross-sectional view of a semiconductor device in accordance with the present invention; and FIG. 5 include an enlarged cross-sectional view of a capacitor structure in accordance with the present invention.

DETAILED DESCRIPTION OF THE DRAWINGS

In general, the present invention provides new semiconductor device structures employing silicon nitride layers formed using a Jet Vapor Deposition (JVD) process. Described below are structures that use Jet Vapor Deposition silicon nitride, hereinafter referred to as JVD silicon nitride. Such structures include a tunnel dielectric film in a non-volatile memory device, an inter-poly dielectric film in a capacitor structure, and a gate dielectric structure or a passivation film for a semiconductor device. Unlike conventional silicon nitride films, a JVD silicon nitride film is formed without using a hydrogen-containing nitrogen source gas.

JVD silicon nitride films differ from conventional silicon nitride films in that they conduct current predominantly with Fowler-Nordheim tunneling rather than Frenkel-Poole conduction. The present invention takes advantage of this feature in novel semiconductor structures using a JVD silicon nitride layer in the formation of a semiconductor device. Such structures are not practical with conventional silicon nitride films due to their widely-recognized poor electrical and physical properties.

Figure 1:
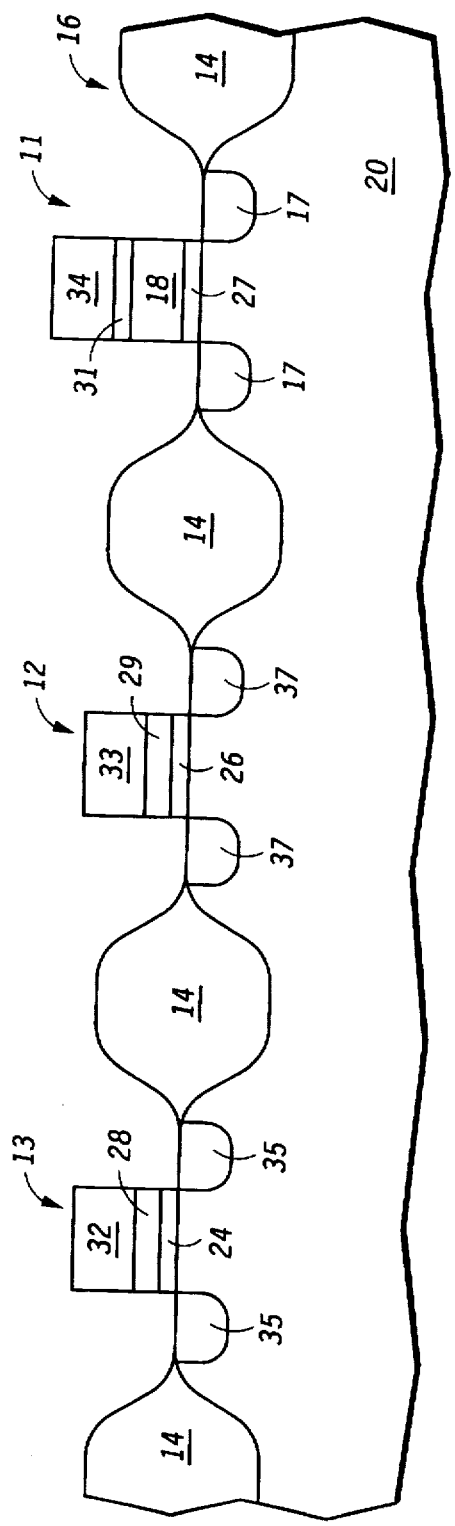
FIG. 1 includes an enlarged cross-sectional view of an integrated circuit in accordance with the present invention.

Turning now to FIG. 1, a more detailed description of the present invention is provided. FIG. 1 is an enlarged cross-sectional view of an integrated circuit 10 that comprises a non-volatile memory device 11, a first transistor 13, and a second transistor 12. The three semiconductor devices illustrate applications for JVD silicon nitride in accordance with the present invention. A detailed description of a method for manufacturing integrated circuit 10 will be provided shortly.

Non-volatile memory device 11 is used to store a logic state that will be retained should power be lost to non-volatile memory device 11. For example, non-volatile memory device 11 could be an electrically programmable read only memory (EPROM), an electrically erasable and programmable read only memory (EEPROM), a flash electrically programmable read only memory (flash EPROM), or a flash electrically erasable and programmable read only memory (flash EEPROM).

Non-volatile memory device 11 comprises a tunnel dielectric layer 27, a floating gate electrode 18, an inter-poly dielectric layer 31, and a control gate electrode 34. Both tunnel dielectric layer 27 and inter-poly dielectric layer 31 can be formed from a layer of JVD silicon nitride as will be described shortly. The relatively low trap density of JVD silicon nitride allows non-volatile memory device 11 to be programmed or erased using Fowler-Nordheim tunneling. If tunnel dielectric layer 27 was made from conventional silicon nitride films, the leakage due to Frenkel-Poole conduction would cause non-volatile memory device 11 to lose the logic value stored on floating gate electrode 18.

The use of JVD silicon nitride for tunnel dielectric layer 27 also has an unexpected benefit of improved resistance to stress-induced leakage compared to some traditional silicon dioxide tunnel dielectric layers. Stress-induced leakage is characterized as a change in the dielectric current-voltage characteristic such that the current through the dielectric increases at low fields following a dielectric voltage stress. Conventional silicon dioxide layers show more stress-induced leakage current than JVD silicon nitride films of similar thickness. As a result, the thickness of tunnel dielectric layer 27, made from JVD silicon nitride, can be scaled down further than tunnel dielectric layers made from conventional silicon dioxide material without suffering from the effects of stress-induced leakage. The present invention, therefore, allows the thickness of tunnel dielectric layer 27 to be reduced, which in turn allows the programming voltage of non-volatile memory device 11 to be reduced as well.

Also shown in FIG. 1 is inter-poly dielectric layer 31, which can be made from JVD silicon nitride as well. Floating gate electrode 18 and control gate electrode 34 are preferably formed from doped polysilicon or amorphous silicon. Thus, the combination of floating gate electrode 18, inter-poly dielectric layer 31, and control gate electrode 34 provides a capacitor-like structure. If conventional silicon nitride is used as an inter-poly dielectric material, it must be sandwiched between two layers of insulating material such as silicon dioxide. Such structures are referred to as ONO stacks. As mentioned earlier, conventional silicon nitride is susceptible to leakage currents due to Frenkel-Poole conduction. Therefore, conventional silicon nitride layers are insulated with two layers of silicon dioxide material.

The present invention, however, obviates the need to form these insulating layers of silicon dioxide since JVD silicon nitride conducts predominantly with Fowler-Nordheim tunneling. Thus, the present invention can be used to reduce the number of process steps required to form an inter-poly dielectric material. The elimination of two deposition steps, previously needed to form the silicon dioxide layers, will result in a significant reduction in the manufacturing cost of non-volatile memory device 11 or other capacitor structures.

Turning now to the other semiconductor devices of integrated circuit 10, a detailed description of first transistor 13 and second transistor 12 is provided. First transistor 13 could be, for example, a low-voltage logic transistor that is used to provide logic values in integrated circuit 10. As shown in FIG. 1, first transistor 13 comprises a control electrode or a gate electrode 32, which is used to modulate a channel region between current carrying electrodes 35. First transistor 13 also has a gate dielectric stack comprising a first gate dielectric layer 24 and a second dielectric layer 28 that are both made from JVD silicon nitride.

Second transistor 12 could be, for example, a high-voltage device that could be used to provide large voltages for the operation of non-volatile memory device 11. Second transistor 12 comprises a gate electrode 33, which is used to modulate a channel region between current carrying electrodes 37. Second transistor 12 also has a gate dielectric stack comprising a first gate dielectric layer 26 and a second dielectric layer 29 that are both made form JVD silicon nitride. The differences between a low-voltage transistor and a high-voltage transistor can be characterized not only by their function, but by their relative gate to drain voltages. In the preferred embodiment, second transistor 12 is a high-voltage transistor that has a gate to drain voltage that is at least about 1.0 volt greater than the gate to drain voltage of a low-voltage transistor such as first transistor 13. In addition, first transistor 13 and second transistor 12 are meant to be of the same conductivity; i.e. both p-type or n-type. However, it should also be understood that it is possible to form first transistor 13 and second transistor 12 such that they are of opposite conductivity.

In the present invention, the gate dielectric material of first transistor 13 and second transistor 12 is formed using the same JVD silicon nitride deposition step. In other words, the first transistor 13 and the second transistor 12 have the same JVD silicon nitride thickness. This is done to reduce the number of manufacturing steps that are required to form integrated circuit 10. Some conventional integrated circuits use silicon dioxide to form the gate dielectric material for low and high voltage transistors and an ONO stack to form an inter-poly dielectric material for non-volatile memory devices. Such integrated circuits require more processing steps and suffer from increased manufacturing complexity than integrated circuit 10 of the present invention.

Figure 2:
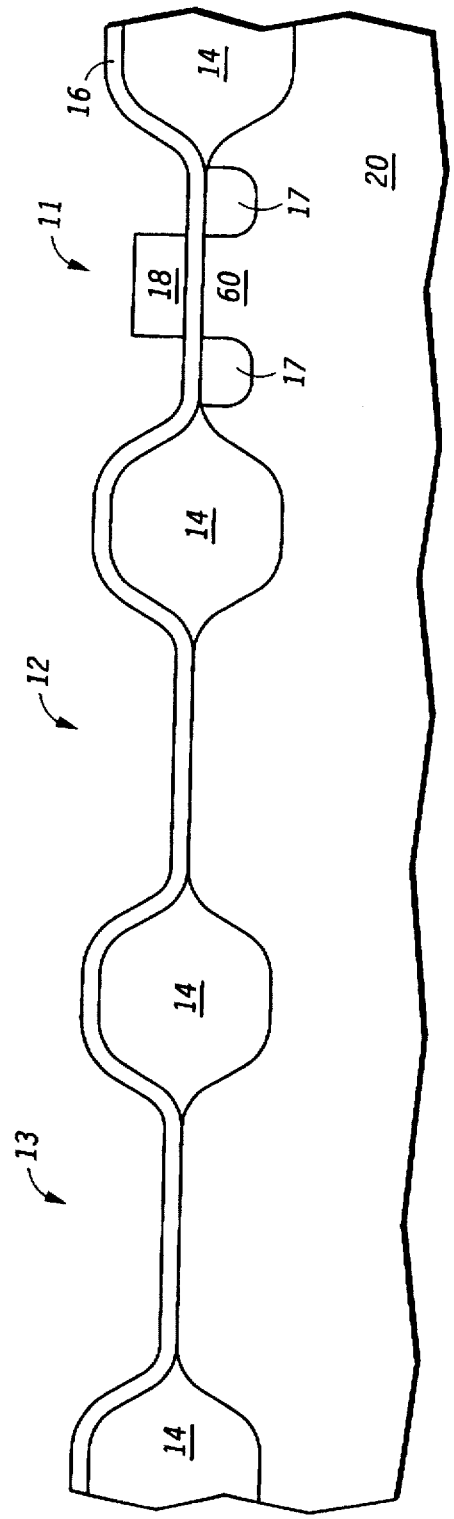

Turning now to FIG. 2, a method of forming integrated circuit 10 in accordance with the present invention is provided. First, isolation regions 14 are formed on a substrate 20 to define the regions where first transistor 13, second transistor 12, and non-volatile memory device 11 are to be formed as indicated by arrows 13, 12, and 11, respectively. A first layer of JVD silicon nitride 16 is then deposited on substrate 20 so that it has a trap density of less than about $1 \times 10^{11}$ traps/cm$^2$ and a hydrogen concentration of less than about 10 atomic percent. Both concentrations are characteristics of JVD silicon nitride and are significantly different than the concentrations found in either conventional CVD or PECVD silicon nitride. The thickness of first layer of JVD silicon nitride 16 can be adjusted to control the programming and erasing characteristics of non-volatile memory device 11. Preferably, first layer of JVD silicon nitride 16 is about 40 angstroms to 500 angstroms thick.

The JVD silicon nitride 16 is deposited using an inner tube and an outer tube. Silane ($SiH_4$) and helium flow in the inner tube at flow rates of approximately 0.7–1.0 standard cubic centimeters per minute (SCCM) and approximately 250–280 SCCM, respectively. Nitrogen ($N_2$) and helium flow in the outer tube at flow rates of approximately 380–420 SCCM and approximately 2700–3000 SCCM, respectively. The pressures of the inner and outer tubes are approximately 24–26 torr and approximately 2.4–2.6 torr, respectively. The chamber pressure is typically in a range of approximately 1.0–1.5 torr. Generally, the pressure of the inner tube is approximately 8–12 times higher than the pressure of the outer tube, and the pressure of the outer tube is approximately 1.7–2.3 times higher that the pressure of the chamber. The deposition is performed at a radio frequency (RF) power of approximately 70–90 watts.

These deposition parameters cause the gases to flow at a supersonic velocity. A reaction between the silane and nitrogen gases causes silicon nitride to form on the exposed surface. The silicon nitride formed by this JVD method has significantly less hydrogen compared to conventional silicon nitride films. As used below, The silicon nitride formed by the previously described JVD method will be called "JVD silicon nitride."

After deposition, floating gate electrode 18, a first control electrode, is formed from a layer of polysilicon or amorphous silicon. Current carrying electrodes 17 are then formed in substrate 20 to provide a channel region 60. Current carrying electrodes 17 can be formed using either a diffusion or implantation process to provide the structure shown in FIG. 2.

Turning now to FIG. 3, the manufacture of integrated circuit 10 continues with the deposition of a second layer of JVD silicon nitride 21. Second layer of JVD silicon nitride 21 is about 40 angstroms to 500 angstroms thick and is formed over floating gate electrode 18 and in the regions where first transistor 13 and second transistor 12 are to be formed. A layer of polysilicon 23 or amorphous silicon is then formed over second layer of JVD silicon nitride 21 to complete the structure show in FIG. 3.

Referring now to FIG. 1, the final processing steps of integrated circuit 10 are provided. Using a sequence of reactive ion etches (RIE), layer of polysilicon 23, second layer of JVD silicon nitride 21, and first layer of JVD silicon nitride 16 are patterned. A JVD silicon nitride film etches essentially the same as a conventional silicon nitride film. Layer of polysilicon 23 provides the gate electrodes 32 and 33 of first transistor 13 and second transistor 12, respectively, as well as control gate electrode 34, a second control electrode, of non-volatile memory device 11. Second layer of JVD silicon nitride 21 and first layer of JVD silicon nitride 16 provide a gate dielectric stack for first transistor 13 and second transistor 12. In addition, second layer of JVD silicon nitride 21 provides inter-poly dielectric layer 31 and first layer of JVD silicon nitride 16 provides tunnel dielectric layer 27, both of non-volatile memory device 11.

One advantage of the present invention is that the deposited layers of JVD silicon nitride are used as part of the low voltage and high voltage transistors as well as part of the non-volatile memory device. Some previously known integrated circuits require that the gate dielectric and inter-poly dielectric layers of the transistors and non-volatile memory devices be formed separately. This is essentially done by masking off the transistor region as portions of the non-volatile device are formed and then masking off the non-volatile memory device as the transistor is formed. As a result, these previously known integrated circuits require four additional depositions steps and three additional photolithographic and etch steps. The present invention, therefore, can significantly reduce the number of processing steps and manufacturing cost to form integrated circuit 10 when compared to some previously known circuits.

In addition, one difficulty in scaling the size of conventional transistors is the operational limitation imposed by the capacitance of the gate dielectric material used to form the transistor. For example, if silicon dioxide is used as the gate dielectric material, a 50% reduction in gate oxide thickness will result in a 100% increase in gate capacitance. At the same operational voltage, this will result in a 50% decrease in operational frequency. At the same time, as the thickness of gate dielectric materials are decreased, the maximum voltage that can be placed on the gate electrode of the transistor is also reduced. Therefore, it is quite common that the gate dielectric material of low voltage transistors is formed separately from the gate dielectric materials of the high voltage transistors. This adds processing complexity and cost to these previously known circuits.

The present invention, however, obviates the need to form separate gate dielectric materials due to the electrical properties of JVD silicon nitride. JVD silicon nitride has a dielectric constant that is approximately twice that of conventional silicon dioxide. Therefore, a layer of JVD silicon nitride can have twice the thickness of a layer of silicon dioxide and still have the same capacitive value. At the same time, the extra thickness of the JVD silicon nitride layer will have a higher breakdown voltage than the layer of silicon dioxide. The same thickness of JVD silicon nitride can be used as the gate dielectric material for low voltage and high voltage transistors, and thus save the cost associated with forming transistors with different gate dielectric thicknesses.

Turning now to FIG. 4, additional applications of JVD silicon nitride are provided. FIG. 4 is an enlarged cross-sectional view of a portion of a semiconductor device 40 formed on a semiconductor substrate 36. Semiconductor device 40 comprises a gate electrode 46 overlying a gate dielectric stack composed of a layer of silicon dioxide 43 and a layer of JVD silicon nitride 44. The dielectric stack takes advantage of an unexpected benefit of JVD silicon nitride. JVD silicon nitride retards the diffusion of dopants, such as boron, better than conventional silicon dioxide layers. The gate electrode of most transistors is doped to either adjust the threshold voltage of the transistor or reduce its resistance. During the fabrication of such transistors, the dopant tends to migrate across the gate dielectric material and degrade the performance of the transistor. The combination of layer of silicon dioxide 43 and layer of JVD silicon nitride 44 provides a structure that has an increased capacitance value and improved resistance to the migration of dopants from gate electrode 46.

Also shown in FIG. 4 is a passivation layer 47 overlying semiconductor device 40. As used in this specification, a passivation layer is the uppermost layer of a device formed after the uppermost interconnect level. The passivation layer 47 is used to protect the underlying semiconductor device 40 from scratches, mobile ions, and moisture. Although not shown in FIG. 4, bond pad openings are extended through the passivation layer 47 to bond pads within the uppermost interconnect level. Bonding wires are subsequently formed to the bond pads.

As mentioned earlier, JVD silicon nitride has a much lower hydrogen concentration compared to conventional CVD or PECVD silicon nitride. Conventional silicon nitride has a hydrogen concentration on the order of 20 to 30 atomic percent. The presence of hydrogen in such a large concentration degrades the performance and reliability of non-volatile memory devices. However, the JVD silicon nitride layer of the present invention has a hydrogen concentration of about less than 10 atomic percent, which makes it suitable as a passivation layer for all semiconductor devices including non-volatile memory devices.

Currently, JVD silicon nitride deposits at a rate less than ten angstroms per minute and usually deposits at about three angstroms per minute. Most passivation layers have thicknesses of at least 2000 angstroms. Processing 25 substrates to form a passivation layer including a JVD nitride film of 2000 angstroms would take more than 11 days on a single wafer processing apparatus at a deposition rate of three angstroms per minute.

Turning now to FIG. 5 an additional application for JVD silicon nitride is provided. FIG. 5 is an enlarged cross-sectional view of a portion of a capacitor 41 that can be formed on a semiconductor substrate 42 using a layer of JVD silicon nitride. Capacitor 41 has an inter-poly dielectric layer 51 comprising JVD silicon nitride that is formed between a first electrode 49 and a second electrode 52. As shown, the single layer of inter-poly dielectric layer 51 can replace the multiple layer of silicon dioxide-silicon nitride-silicon dioxide (ONO) stack that is common with many capacitor structures. Since JVD silicon nitride does not conduct predominantly with Frenkel-Pool conduction, there is no need to isolate inter-poly dielectric layer 51 between two layers of silicon dioxide. The present invention, therefore, reduces the manufacturing cost of capacitor 41 compared to capacitor structures that require an ONO stack as the inter-poly dielectric material.

Skilled artisans appreciate that the present invention provides semiconductor devices and methods for making the same that have improved electrical performance and reduced manufacturing cost. The formation of these devices using conventional CVD or PECVD silicon nitride films would result in devices that have degraded performance or higher manufacturing cost. Since JVD silicon nitride has a lower trap density and hydrogen concentration than conventional CVD or PECVD silicon nitride, it is advantageously used as a tunnel dielectric material, as part of a gate dielectric stack, as an inter-poly dielectric, and as a passivation layer. The electrical and physical properties of JVD silicon nitride allow semiconductor devices to be formed with less processing complexity and at a reduced cost.

We claim:

1. A method of forming a semiconductor device comprising the steps of:

depositing a first silicon nitride film on a semiconductor material using a silicon gas source and a nitrogen gas source, wherein the nitrogen gas source does not contain hydrogen, and wherein at least one of the silicon and nitrogen gas sources flows at a supersonic velocity;

forming a first gate electrode over the first silicon nitride film;

forming current carrying electrodes adjacent to the first gate electrode;

depositing a second silicon nitride film on the first gate electrode using the silicon gas source and the nitrogen gas source, wherein the nitrogen gas source does not contain hydrogen, and wherein at least one of the silicon and nitrogen gas sources flows at a supersonic velocity during this step; and forming a second gate electrode over the second silicon nitride film and the first gate electrode.

2. The method of claim 1, wherein the first silicon nitride film, as deposited, has a trap density of less than about $1\times10^{11}$ traps/cm$^2$ and a hydrogen concentration of less than about 10 atomic percent.

3. The method of claim 1, wherein the step of depositing comprises steps of:

flowing the silicon gas source and a first diluent through a first tube, wherein a silicon gas source concentration within the first tube is at least approximately 2,500 parts per million; and flowing the nitrogen gas source and a second diluent through a second tube.

4. The method of 3, wherein:

the step of flowing the silicon gas source and the first diluent includes substeps of:

flowing silane at a rate in a range of approximately 0.7–1.0 standard cubic centimeters per minute;

flowing helium at a rate in a range of approximately 250–280 standard cubic centimeters per minute; and the step of flowing the nitrogen gas source and the second diluent includes substeps of:

flowing nitrogen at a rate in a range of approximately 380–420 standard cubic centimeters per minute; and flowing helium at a rate in a range of approximately 2700–3000 standard cubic centimeters per minute.

5. The method of claim 1, wherein the step of depositing comprises steps of:

flowing a first gas including the silicon gas source through a first tube having a pressure no higher than approximately 26 torr;

flowing a second gas including the nitrogen gas source through a second tube having a pressure at least approximately 2.4 torr; and reacting the silicon gas source and nitrogen gas source within a chamber have a pressure no higher than 1.5 torr.

6. The method of claim 1, wherein the step of depositing comprises steps of:

flowing a first gas including the silicon gas source through a first tube having a first pressure;

flowing a second gas including the nitrogen gas source through a second tube having a second pressure, wherein the first pressure is in a range of approximately 8–12 times higher than the second pressure; and reacting the silicon gas source and nitrogen gas source within a chamber have a third pressure, wherein the second pressure is in a range of approximately 1.7–2.3 times higher than the second pressure.

7. The method of claim 1, wherein the step of depositing comprises depositing at a radio frequency power in a range of approximately 70–90 watts.

8. The method of claim 1, wherein:

the step of depositing the first silicon nitride film comprises depositing the first silicon nitride film over a first active region within the semiconductor material to form a tunnel dielectric layer consisting essentially of the first silicon nitride film;

the step of forming the first gate electrode comprises a step of forming a silicon-containing floating gate electrode on the tunnel dielectric layer;

the step of depositing the second silicon nitride film comprises depositing the second silicon nitride film to form an inter-gate dielectric layer consisting essentially of the second silicon nitride film; and the step of forming the second gate electode comprises a step of forming a silicon-containing control gate electrode on the inter-gate dielectric layer to form a nonvolatile memory cell that includes tunnel dielectric layer, the floating gate electrode, the inter-gate dielectric layer, and the control gate electrode.

9. The method of claim 8, wherein: the step of the step of depositing the first silicon nitride film comprises depositing the first silicon nitride film over a second active region within the semiconductor material;

the step of forming the first gate electrode comprises a step of forming a silicon-containing floating gate electrode over the first active region but not the second active region;

the step of depositing the second silicon nitride film comprises depositing the second silicon nitride film over a portion of the first silicon nitride film that overlies the second active region, wherein a gate dielectric layer includes the first and second silicon nitride films; and the step of forming the second gate electrode comprises a step of forming a silicon-containing gate electrode on the gate dielectric layer to form a second transistor that includes the gate dielectric layer and the silicon-containing gate electrode.

10. The method of claim 9, wherein the second transistor is a high-voltage device.

11. A method of forming a semiconductor device comprising the steps of:

depositing a first silicon nitride film over a semiconductor material using a silicon gas source and a nitrogen gas source, wherein:

the nitrogen gas source does not contain hydrogen;

at least one of the silicon and nitrogen gas sources flows at a supersonic velocity; and this step comprises the steps of:

flowing the silicon gas source and a first diluent through a first tube, wherein a silicon gas source concentration within the first tube is at least approximately 2,500 parts per million; and flowing the nitrogen gas source and a second diluent through a second tube;

forming a first gate electrode over the first silicon nitride film; and forming current carrying electrodes adjacent to the first gate electrode.

12. The method of claim 11, further comprising steps of:

depositing a second silicon nitride film on the first gate electrode using the silicon gas source and the nitrogen gas source, wherein the nitrogen gas source does not contain hydrogen, and wherein at least one of the silicon and nitrogen gas sources flows at a supersonic velocity during this step; and forming a second gate electrode over the second silicon nitride film and the first gate electrode.

13. The method of claim 11, wherein the step of flowing the silicon gas source comprises a step of flowing the silicon gas source and the first diluent through the first tube, wherein a silicon gas source concentration within the first tube is no higher than approximately 4,000 parts per million.

14. The method of claim 13, wherein:

the step of flowing the silicon gas source and the first diluent includes substeps of:

flowing silane at a rate in a range of approximately 0.7–1.0 standard cubic centimeters per minute;

flowing helium at a rate in a range of approximately 250–280 standard cubic centimeters per minute; and the step of flowing the nitrogen gas source and the second diluent includes substeps of:

flowing nitrogen at a rate in a range of approximately 380–420 standard cubic centimeters per minute; and flowing helium at a rate in a range of approximately 2700–3000 standard cubic centimeters per minute.

15. The method of claim 11, wherein the step of depositing comprises steps of:

flowing a first gas including the silicon gas source through a first tube having a first pressure;

flowing a second gas including the nitrogen gas source through a second tube having a second pressure, wherein the first pressure is in a range of approximately 8–12 times higher than the second pressure; and reacting the silicon gas source and nitrogen gas source within a chamber have a third pressure, wherein the second pressure is in a range of approximately 1.7–2.3 times higher than the second pressure.

16. A method of forming a semiconductor device comprising the steps of:

forming a first gate electrode over a substrate;

depositing a first silicon nitride film on the first gate electrode using a silicon gas source and a nitrogen gas source, wherein the nitrogen gas source does not contain hydrogen, and wherein at least one of the silicon and nitrogen gas sources flows at a supersonic velocity;

forming a second gate electrode over the first silicon nitride film; and forming current carrying electrodes adjacent to the first gate electrode.

17. The method of claim 16, further comprising steps of depositing a second silicon nitride film over a substrate before the step of forming the first gate electrode, wherein:

this step uses the silicon gas source and the nitrogen gas source;

the nitrogen gas source does not contain hydrogen; and at least one of the silicon and nitrogen gas sources flows at a supersonic velocity during this step.

18. The method of claim 16, wherein the step of depositing comprises steps of:

flowing the silicon gas source and a first diluent through a first tube, wherein a silicon gas source concentration within the first tube is in a range approximately 2,500–4,000 parts per million; and flowing the nitrogen gas source and a second diluent through a second tube.

19. The method of claim 16, wherein the step of depositing comprises steps of:

flowing a first gas including the silicon gas source through a first tube having a pressure no higher than approximately 26 torr;

flowing a second gas including the nitrogen gas source through a second tube having a pressure at least approximately 2.4 torr; and reacting the silicon gas source and nitrogen gas source within a chamber have a pressure no higher than 1.5 torr.

20. The method of claim 16, wherein the step of depositing comprises steps of:

flowing a first gas including the silicon gas source through a first tube having a first pressure;

flowing a second gas including the nitrogen gas source through a second tube having a second pressure, wherein the first pressure is in a range approximately 8–12 times higher than the second pressure; and reacting the silicon gas source and nitrogen gas source within a chamber have a third pressure, wherein the second pressure is in a range of approximately 1.7–2.3 times higher than the second pressure.

21. The method of claim 16, wherein the step of depositing comprises depositing at a radio frequency power in a range of approximately 70–90 watts.

22. The method of claim 16, wherein the first electrode is a floating gate electrode, and wherein the second gate electrode is a control gate electrode.

* * * * *